US011031459B2

(12) United States Patent
Yamada

(10) Patent No.: US 11,031,459 B2
(45) Date of Patent: Jun. 8, 2021

(54) SEMICONDUCTOR DEVICE INCLUDING A CAPACITOR AND METHOD OF MANUFACTURING SEMICONDUCTOR DEVICE

(71) Applicants: Kabushiki Kaisha Toshiba, Tokyo (JP); Toshiba Electronic Devices & Storage Corporation, Tokyo (JP)

(72) Inventor: Masaki Yamada, Saitama (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 16/800,088

(22) Filed: Feb. 25, 2020

(65) Prior Publication Data

US 2021/0091170 A1 Mar. 25, 2021

(30) Foreign Application Priority Data

Sep. 20, 2019 (JP) ............................ JP2019-171103

(51) Int. Cl.
*H01L 49/02* (2006.01)
*H01L 23/64* (2006.01)
(Continued)

(52) U.S. Cl.
CPC ........ *H01L 28/60* (2013.01); *H01L 21/02126* (2013.01); *H01L 23/5223* (2013.01); *H01L 23/642* (2013.01); *H01L 24/45* (2013.01)

(58) Field of Classification Search
CPC ............... H01L 28/60; H01L 21/02126; H01L 23/5223; H01L 23/642; H01L 24/45
See application file for complete search history.

(56) References Cited

U.S. PATENT DOCUMENTS

2001/0019145 A1* 9/2001 Yamanaka ........ H01L 21/32134 257/296
2008/0020540 A1* 1/2008 Takeda ............. H01L 21/76811 438/393

(Continued)

FOREIGN PATENT DOCUMENTS

JP 2004-39724 A 2/2004
JP 5135827 B2 2/2013
WO 2009-122496 A1 10/2009

*Primary Examiner* — John P. Dulka
(74) *Attorney, Agent, or Firm* — White & Case LLP

(57) ABSTRACT

A semiconductor device according to an embodiment includes a semiconductor substrate, a wiring layer on or above the semiconductor substrate, the wiring layer having a first metal layer and a second metal layer in contact with the first metal layer, a capacitor lower electrode on or above the semiconductor substrate, the capacitor lower electrode being the same material as the second metal layer, a capacitor insulating film on the capacitor lower electrode, and a capacitor upper electrode on the capacitor insulating film. A distance from the semiconductor substrate to an upper face of the capacitor lower electrode is equal to or less than a distance from the semiconductor substrate to an upper face of the wiring layer, and a distance from the semiconductor substrate to a lower face of the capacitor lower electrode is greater than a distance from the semiconductor substrate to a lower face of the wiring layer.

9 Claims, 19 Drawing Sheets

(51) Int. Cl.

| | |
|---|---|
| ***H01L 21/02*** | (2006.01) |
| ***H01L 23/00*** | (2006.01) |
| ***H01L 23/522*** | (2006.01) |

(56) References Cited

U.S. PATENT DOCUMENTS

2010/0181647 A1 7/2010 Imai et al.
2011/0042785 A1 2/2011 Ohkawa
2012/0068185 A1* 3/2012 Kim ........................ H01L 28/60 257/72
2012/0193760 A1* 8/2012 Manabe ............ H01L 27/10814 257/532
2019/0123121 A1* 4/2019 Liu ..................... H01L 27/3246

* cited by examiner 100
36
30
18
18b
18a
14
12
10
20
34
32
d4
d2
d3
d1
28
26
24
22
16

70
64
59
56
54
52
50
10
58
68
66
68
56
68
54a
62
60

200
36
30
18
18b
18a
14
12
10
20
34
32
34
32
18b
28
26
24
22
16

SEMICONDUCTOR DEVICE INCLUDING A CAPACITOR AND METHOD OF MANUFACTURING SEMICONDUCTOR DEVICE

CROSS-REFERENCE TO RELATED APPLICATION

This application is based upon and claims the benefit of priority from Japanese Patent Application No. 2019-171103, filed on Sep. 20, 2019, the entire contents of which are incorporated herein by reference.

FIELD

Embodiments described herein relate generally to a semiconductor device and a method of manufacturing semiconductor device.

BACKGROUND

As a communications LSI incorporated into a portable telephone or the like, an analog-digital mixed LSI, in which an analog LSI and a digital LSI are mixed, is used. From the perspective of enhancing the characteristics of an analog-digital mixed LSI, enhancing the characteristics of analog-LSI passive elements, for example, enhancing the characteristics of capacitors, is required.

A metal-insulator-metal capacitor (MIM capacitor) uses a metal film for an upper electrode and a lower electrode of the capacitor. By using a metal film for the upper electrode and lower electrode, the parasitic resistance and parasitic capacitance of the capacitor is reduced in comparison with a case where polycrystalline silicon film, for example, is used. Therefore, enhancements to the capacitor characteristics can be realized.

However, by adopting a MIM capacitor, the manufacturing process becomes complex, and there is a risk of a drop in the device yield. In order to suppress a drop in the device yield, a MIM capacitor having an easily manufactured structure is desirable.

DETAILED DESCRIPTION

Figure 1:
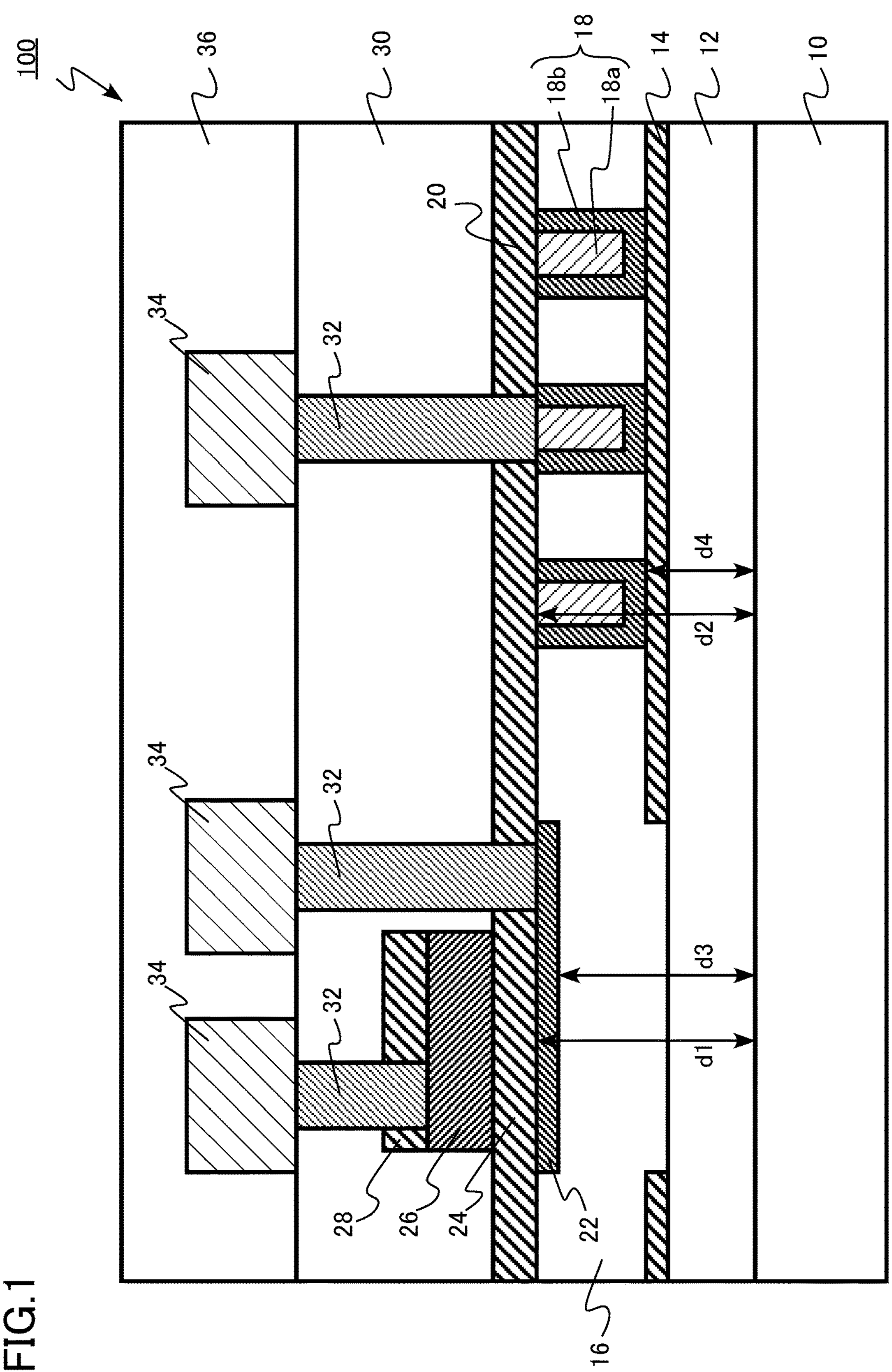
FIG. 1 is a schematic cross-sectional view of a semiconductor device according to a first embodiment.

A semiconductor device according to an aspect of the present invention includes: a semiconductor substrate; a wiring layer provided on or above the semiconductor substrate, the wiring layer having a first metal layer and a second metal layer in contact with a lower face and a side face of the first metal layer; a capacitor lower electrode provided on or above the semiconductor substrate, the capacitor lower electrode being the same material as the second metal layer; a capacitor insulating film provided on the capacitor lower electrode; and a capacitor upper electrode provided on the capacitor insulating film, wherein a distance from the semiconductor substrate to an upper face of the capacitor lower electrode is equal to or less than a distance from the semiconductor substrate to an upper face of the wiring layer, and a distance from the semiconductor substrate to a lower face of the capacitor lower electrode is greater than a distance from the semiconductor substrate to a lower face of the wiring layer.

Note that, in the present specification, the same reference signs are assigned to the same or similar members and duplicate descriptions are sometimes omitted.

In order to illustrate positional relationships of components and the like in the present specification, an upward direction in the drawings is sometimes described as "on" or "above" and a downward direction in the drawings is sometimes described as "below". In this specification, the concepts of "on", "above", and "below" are not necessarily terms denoting relationships with the direction of gravity.

Qualitative analysis and quantitative analysis of the chemical composition of members constituting the semiconductor device in this specification can be performed by secondary ion mass spectrometry (SIMS) and energy dispersive X-ray spectroscopy (EDX), for example. Furthermore, for measurement of the thickness of the members constituting the semiconductor device and of the distance between the members, and so forth, a scanning electron microscope (SEM) or a transmission electron microscope (TEM), for example, can be employed.

First Embodiment

The semiconductor device according to a first embodiment includes: a semiconductor substrate; a wiring layer provided on or above the semiconductor substrate, the wiring layer having a first metal layer and a second metal layer in contact with a lower face and a side face of the first metal layer; a capacitor lower electrode provided on or above the semiconductor substrate, the capacitor lower electrode being the same material as the second metal layer; a capacitor insulating film provided on the capacitor lower electrode; and a capacitor upper electrode provided on the capacitor insulating film, wherein a distance from the semiconductor substrate to an upper face of the capacitor lower electrode is equal to or less than a distance from the semiconductor substrate to an upper face of the wiring layer, and a distance from the semiconductor substrate to a lower face of the capacitor lower electrode is greater than a distance from the semiconductor substrate to a lower face of the wiring layer.

FIG. 1 is a schematic cross-sectional view of a semiconductor device according to the first embodiment. The semiconductor device according to the first embodiment is an analog-digital mixed LSI 100. The analog-digital mixed LSI 100 has a mixture of analog LSI and digital LSI on the same semiconductor chip. The analog-digital mixed LSI 100 includes metal multilayer wiring and a MIM capacitor.

The analog-digital mixed LSI 100 includes a silicon substrate 10 (semiconductor substrate); a first interlayer insulating layer 12; a first etching stopper film 14; a second interlayer insulating layer 16; a first wiring layer 18 (wiring layer); a cap insulating film 20; a capacitor lower electrode 22; a capacitor insulating film 24; a capacitor upper electrode 26; a second etching stopper film 28; a third interlayer insulating layer 30; a contact plug 32; a second wiring layer 34; and a fourth interlayer insulating layer 36.

The first wiring layer 18 includes a metal layer 18*a* (first metal layer) and a barrier metal layer 18*b* (second metal layer).

The silicon substrate 10 is single-crystal silicon, for example. The silicon substrate 10 is an example of a semiconductor substrate.

The first interlayer insulating layer 12 is provided on or above the silicon substrate 10. The first interlayer insulating layer 12 is silicon oxide, for example.

A semiconductor element such as a transistor or diode (not illustrated), for example, is formed in the silicon substrate 10 and the first interlayer insulating layer 12.

The first etching stopper film 14 is provided on the first interlayer insulating layer 12. The first etching stopper film 14 functions as a stopper when forming, in the second interlayer insulating layer 16, a groove for forming the first wiring layer 18. The first etching stopper film 14 is silicon nitride, for example.

The second interlayer insulating layer 16 is provided on the first etching stopper film 14. The second interlayer insulating layer 16 is silicon oxide, for example.

The first wiring layer 18 is provided on the first etching stopper film 14. The first wiring layer 18 is buried in the second interlayer insulating layer 16. The lower face of the first wiring layer 18 is in contact with the first etching stopper film 14.

The first wiring layer 18 includes a metal layer 18*a* and a barrier metal layer 18*b*. The barrier metal layer 18*b* is in contact with the lower face and a side face of the metal layer 18*a*. The barrier metal layer 18*b* has a function for preventing diffusion of the metal of the metal layer 18*a*, for example.

The metal layer 18*a* is copper, for example. The barrier metal layer 18*b* is, for example, tantalum, titanium, tantalum nitride, titanium nitride, tungsten nitride, or a titanium tungsten alloy.

The cap insulating film 20 is provided on the first wiring layer 18. The cap insulating film 20 is in contact with the upper face of the first wiring layer 18. The cap insulating film 20 is contiguous with the capacitor insulating film 24. The cap insulating film 20 is physically continuous with the capacitor insulating film 24.

The cap insulating film 20 has a function for preventing diffusion of the metal of the metal layer 18*a*, for example. Furthermore, the cap insulating film 20 has a function for preventing oxidation of the metal of the metal layer 18*a*, for example.

The cap insulating film 20 is silicon nitride, silicon carbide, or silicon carbonitride, for example.

The capacitor lower electrode 22 is provided on the second interlayer insulating layer 16. The capacitor lower electrode 22 is buried in a recess in the surface of the second interlayer insulating layer 16.

The capacitor lower electrode 22 is the same material as the barrier metal layer 18*b*. The thickness of the capacitor lower electrode 22 is equal to or less than the thickness of the barrier metal layer 18*b*, for example. The thickness of the capacitor lower electrode 22 is equal to the thickness of the barrier metal layer 18*b*, for example. The capacitor lower electrode 22 and the barrier metal layer 18*b* are formed simultaneously.

The distance (d1 in FIG. 1) from the silicon substrate 10 to the upper face of the capacitor lower electrode 22 is equal to or less than the distance (d2 in FIG. 1) from the silicon substrate 10 to the upper face of the first wiring layer 18. The distance d1 is the same as the distance d2, for example. Furthermore, the distance (d3 in FIG. 1) from the silicon substrate 10 to the lower face of the capacitor lower electrode 22 is greater than the distance (d4 in FIG. 1) from the silicon substrate 10 to the lower face of the first wiring layer 18.

The capacitor insulating film 24 is provided on the capacitor lower electrode 22. The capacitor insulating film 24 is in contact with the capacitor lower electrode 22.

The capacitor insulating film 24 is contiguous with the cap insulating film 20. The capacitor insulating film 24 is the same material as the cap insulating film 20. The thickness of the capacitor insulating film 24 is equal to the thickness of the cap insulating film 20. The capacitor insulating film 24 and the cap insulating film 20 are formed simultaneously.

The capacitor insulating film 24 is silicon nitride, for example.

The capacitor upper electrode 26 is provided on the capacitor insulating film 24. The capacitor upper electrode 26 is in contact with the capacitor insulating film 24.

The capacitor upper electrode 26 is, for example, tantalum, titanium, tantalum nitride, titanium nitride, tungsten nitride, or a titanium tungsten alloy.

The capacitor insulating film 24 is provided between the capacitor lower electrode 22 and the capacitor upper electrode 26. A MIM capacitor is formed from the capacitor lower electrode 22, the capacitor insulating film 24 and the capacitor upper electrode 26.

The second etching stopper film 28 is provided on the capacitor upper electrode 26. The second etching stopper film 28 functions as a stopper when forming, in the third interlayer insulating layer 30, a contact hole of a contact plug 32 which is connected to the capacitor upper electrode 26.

The second etching stopper film 28 is silicon nitride, for example.

The third interlayer insulating layer 30 is formed on the second etching stopper film 28 and the cap insulating film 20. The third interlayer insulating layer 30 is silicon oxide, for example.

Contact plugs 32 are formed in the third interlayer insulating layer 30. A contact plug 32 electrically connects the second wiring layer 34 to the capacitor upper electrode 26, for example. Furthermore, a contact plug 32 electrically connects the second wiring layer 34 to the capacitor lower electrode 22, for example. Additionally, a contact plug 32 electrically connects the second wiring layer 34 to the first wiring layer 18, for example.

The contact plugs 32 are metal, for example. The contact plugs 32 are tungsten, for example.

The second wiring layer 34 is provided on the third interlayer insulating layer 30. The second wiring layer 34 is metal. The second wiring layer 34 is an aluminum alloy, for example.

The fourth interlayer insulating layer 36 is provided on the second wiring layer 34. The fourth interlayer insulating layer 36 is silicon oxide, for example.

An example of a method of manufacturing the semiconductor device according to the first embodiment will be explained next. The method of manufacturing the semiconductor device according to the first embodiment is a method of manufacturing the analog-digital mixed LSI 100, which includes metal multilayer wiring and a MIM capacitor.

The method of manufacturing the semiconductor device according to the first embodiment includes: forming a first insulating film on or above a semiconductor substrate; forming a second insulating film on the first insulating film; removing a partial region of the second insulating film by etching; forming a third insulating film on the second insulating film; forming, in the third insulating film, a groove that reaches the second insulating film; forming a first metal film in the groove and on the third insulating film; forming a second metal film on the first metal film; removing the second metal film on the third insulating film; removing the first metal film on the third insulating film by chemical mechanical polishing while leaving the first metal film in a recess of a surface of the third insulating film formed due to a step generated by the removing the partial region; forming a fourth insulating film on the first metal film and on the third insulating film; forming a third metal film on the fourth insulating film; and patterning the third metal film so as to leave the third metal film on the fourth insulating film, the fourth insulating film being formed on the first metal film in the recess.

FIGS. 2, 3, 4, 5, 6, 7, 8, 9, 10, 11 and 12 are schematic cross-sectional views of the method of manufacturing the semiconductor device according to the first embodiment.

First, semiconductor elements such as transistors (not illustrated) are formed on the silicon substrate 10 by using a well-known manufacturing method. Further, a first insulating film 50 is formed on the silicon substrate 10. The first insulating film 50 is formed using chemical vapor deposition (CVD), for example. The first insulating film 50 is silicon oxide, for example. The first insulating film 50 ultimately becomes the first interlayer insulating layer 12.

Figure 2:
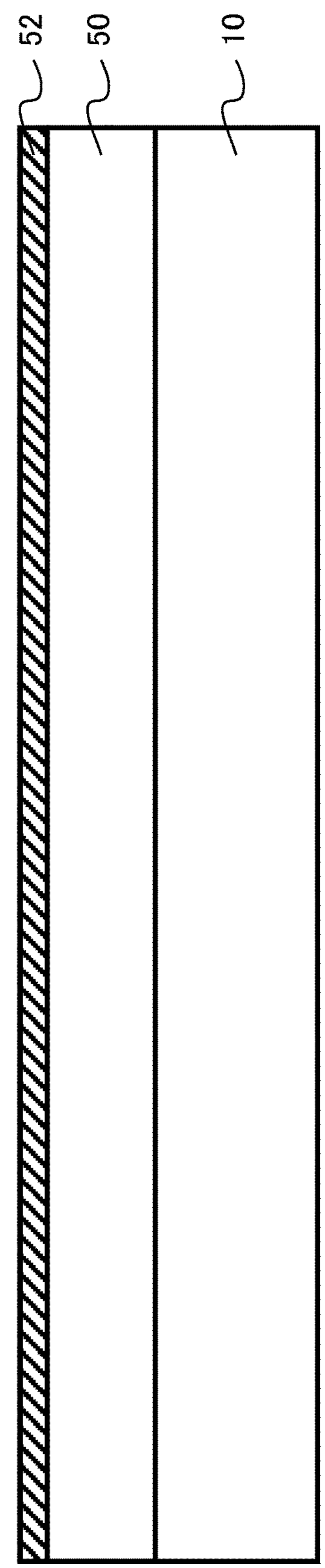
FIG. 2 is a schematic cross-sectional view of a method of manufacturing the semiconductor device according to the first embodiment.

Next, a second insulating film 52 is formed on the first insulating film 50 (FIG. 2). The second insulating film 52 is formed using CVD, for example. The second insulating film 52 is silicon nitride, for example. The second insulating film 52 ultimately becomes the first etching stopper film 14.

Figure 3:
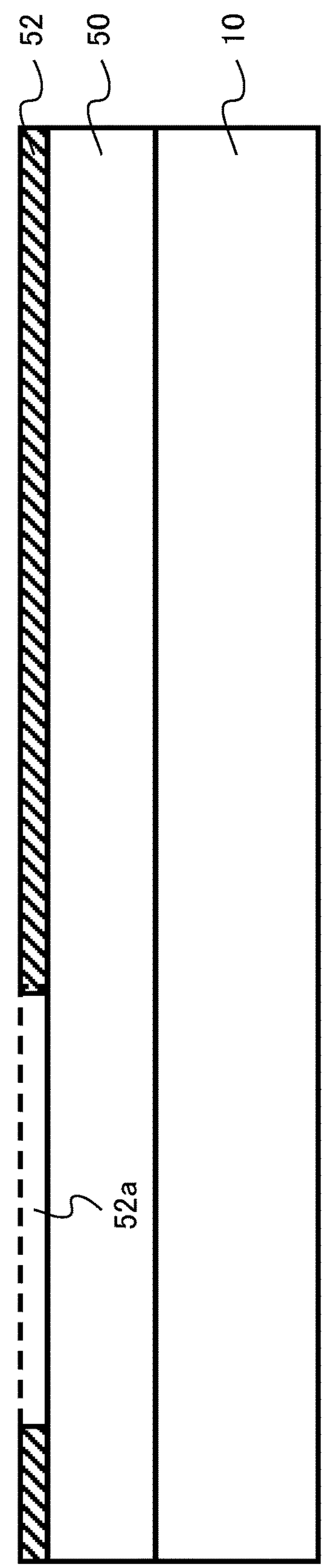
FIG. 3 is a schematic cross-sectional view of the method of manufacturing the semiconductor device according to the first embodiment.

Next, a partial region 52*a* of the second insulating film 52 is removed by etching (FIG. 3). Etching of the partial region 52*a* is carried out using reactive ion etching (RIE) after resist patterning by lithography, for example.

Figure 4:
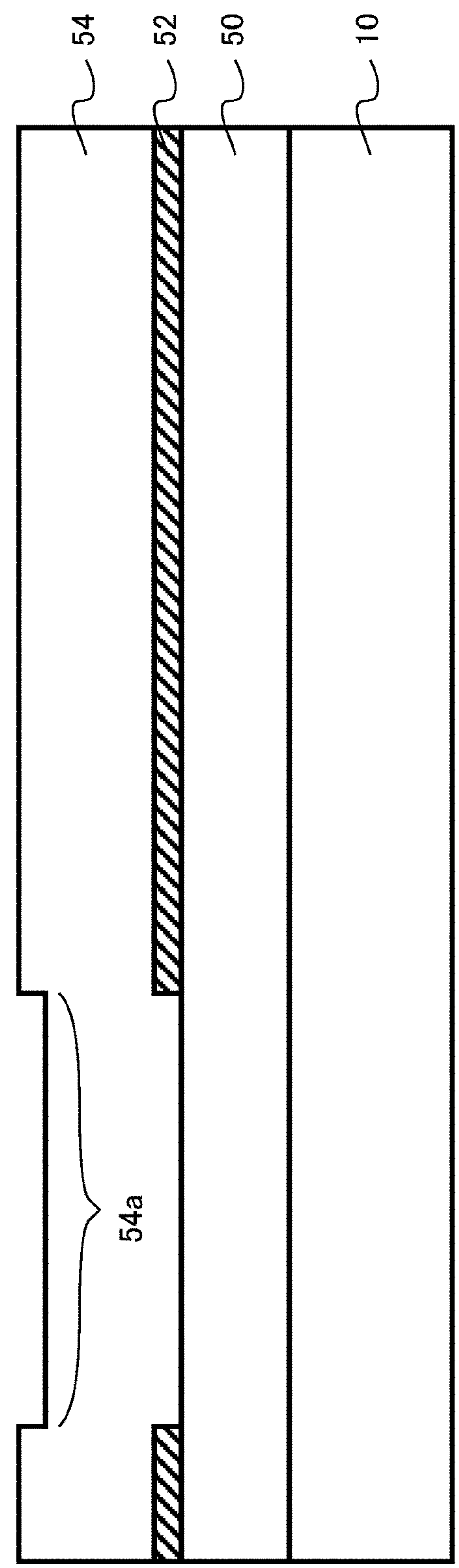
FIG. 4 is a schematic cross-sectional view of the method of manufacturing the semiconductor device according to the first embodiment.

Next, a third insulating film 54 is formed on the second insulating film 52 (FIG. 4). A recess 54*a* is formed in the surface of the third insulating film 54 by a step generated through the etching of the partial region 52*a* of the second insulating film 52.

The third insulating film 54 is silicon oxide, for example. The third insulating film 54 ultimately becomes the second interlayer insulating layer 16.

Figure 5:
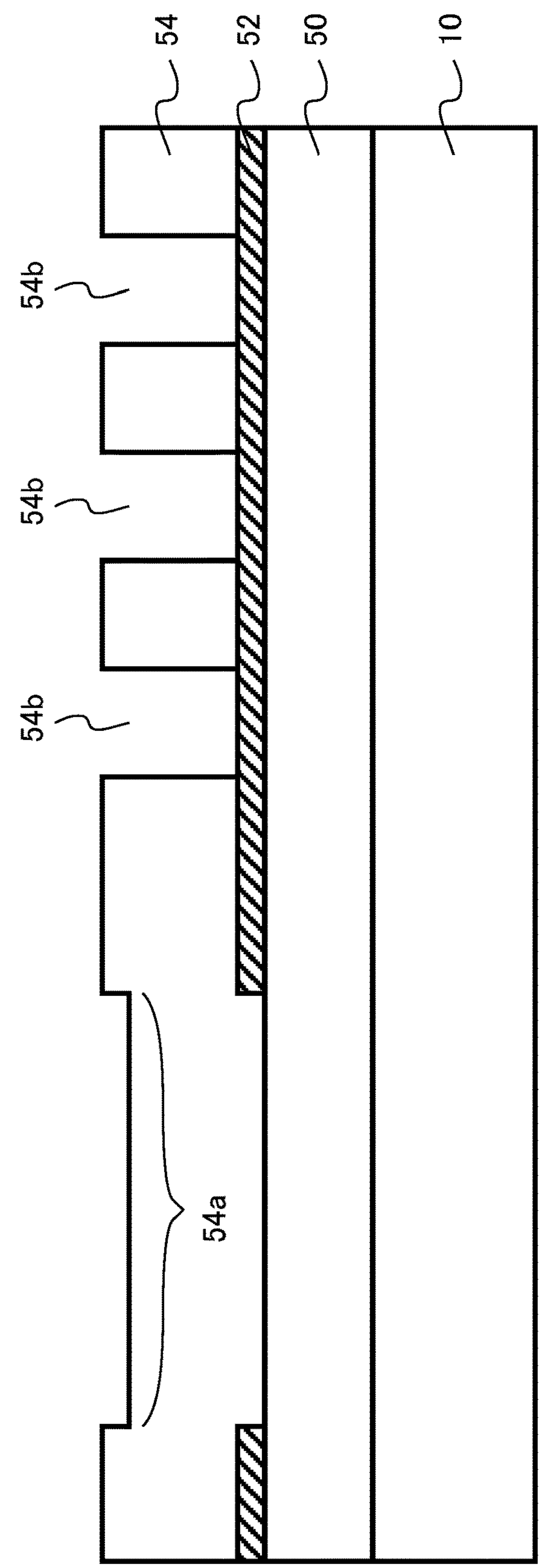
FIG. 5 is a schematic cross-sectional view of the method of manufacturing the semiconductor device according to the first embodiment.

Next, grooves 54*b* are formed in the third insulating film 54 (FIG. 5). The grooves 54*b* reach the second insulating film 52.

The grooves 54*b* are formed using lithography and RIE, for example. The second insulating film 52 serves as a stopper when etching the grooves 54*b*.

Next, a first metal film 56 is formed in the grooves 54*b* and on the third insulating film 54. The first metal film 56 is formed by spattering, for example. The first metal film 56 is, for example, tantalum, titanium, tantalum nitride, titanium nitride, tungsten nitride, or a titanium tungsten alloy. The first metal film 56 ultimately becomes the barrier metal layer 18*b* and the capacitor lower electrode 22.

Figure 6:
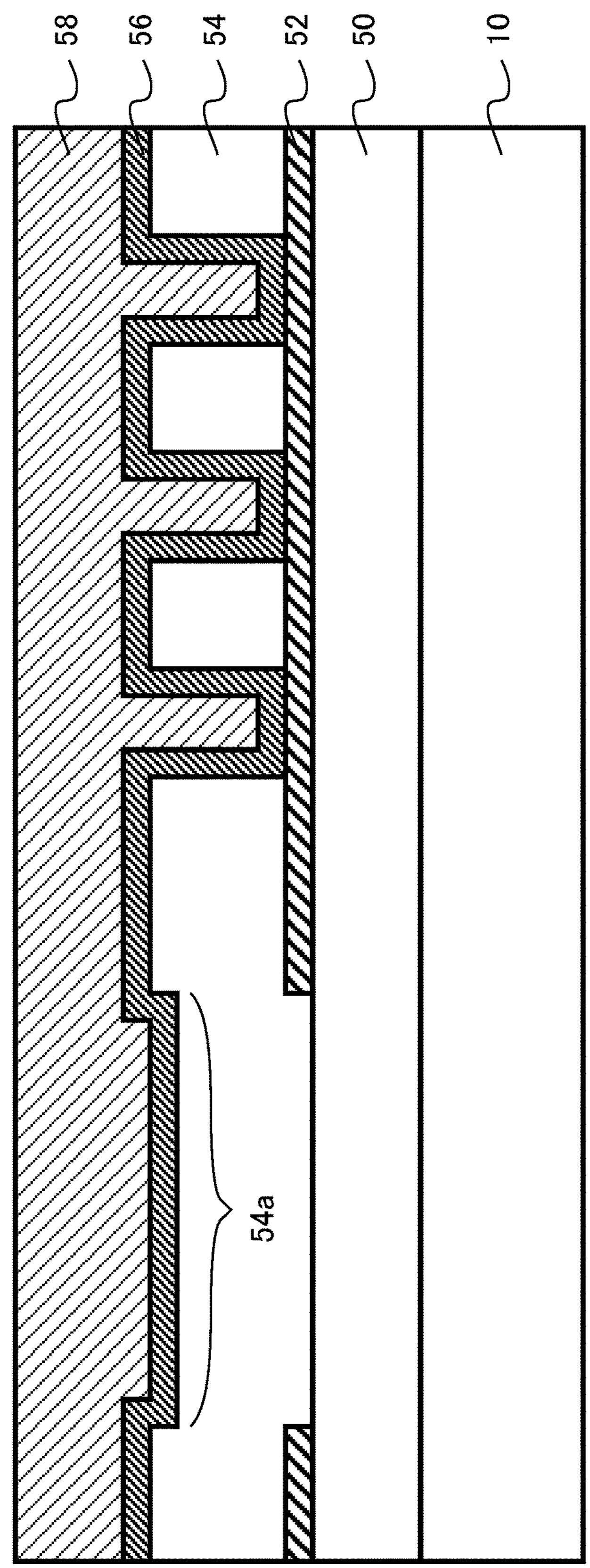
FIG. 6 is a schematic cross-sectional view of the method of manufacturing the semiconductor device according to the first embodiment.

Next, a second metal film 58 is formed on the first metal film 56 (FIG. 6). The second metal film 58 is formed by plating, for example. The second metal film 58 ultimately becomes the metal layer 18*a*.

Next, the second metal film 58 on the third insulating film 54 is removed. The second metal film 58 is removed using chemical mechanical polishing (CMP), for example.

Figure 7:
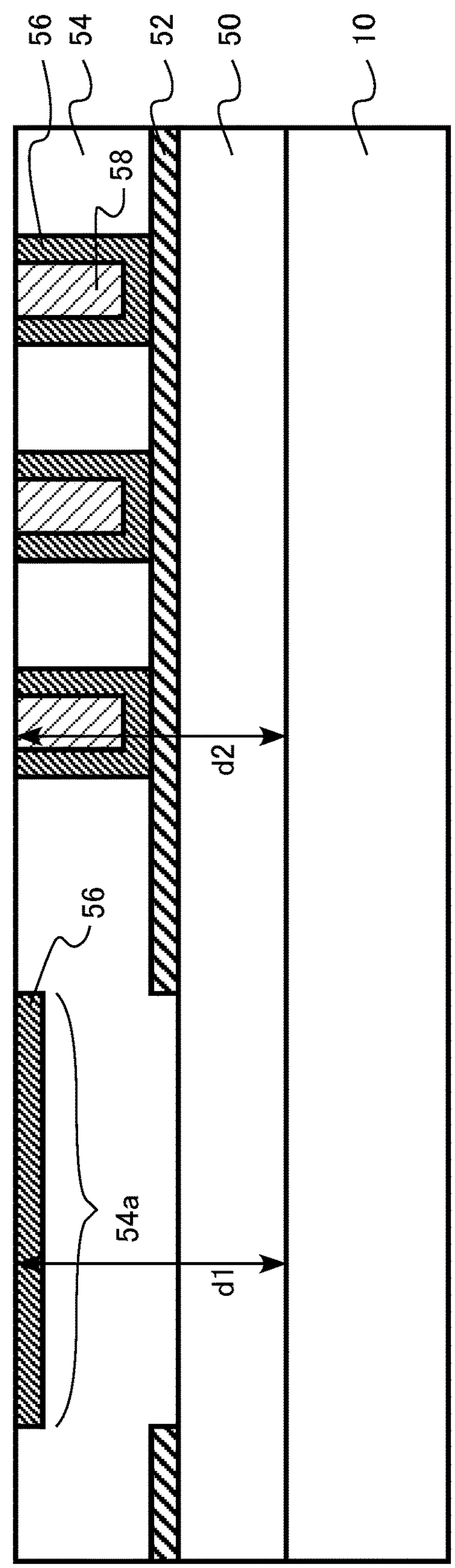
FIG. 7 is a schematic cross-sectional view of the method of manufacturing the semiconductor device according to the first embodiment.

Next, the first metal film 56 on the third insulating film 54 is removed by CMP (FIG. 7). The first metal film 56 is left to remain in the recess 54*a* in the surface of the third insulating film 54.

The distance (d1 in FIG. 7) from the silicon substrate 10 to the upper face of the first metal film 56 in the recess 54*a* is equal to or less than the distance (d2 in FIG. 7) from the silicon substrate 10 to the upper face of the first metal film 56 and the second metal film 58. The distance d1 is ideally the same as the distance d2 but, as a result of the upper face of the first metal film 56 in the recess 54*a* being recessed through dicing, for example, the distance d1 can conceivably be smaller than the distance d2.

Next, a fourth insulating film 59 is formed on the first metal film 56 and the third insulating film 54. The fourth insulating film 59 is formed by spattering, for example. The fourth insulating film 59 is silicon nitride, for example. The fourth insulating film 59 ultimately becomes the cap insulating film 20 and the capacitor insulating film 24.

Next, a third metal film 60 is formed on the fourth insulating film 59. The third metal film 60 is formed by CVD, for example. The third metal film 60 is, for example, tantalum, titanium, tantalum nitride, titanium nitride, tungsten nitride, or a titanium tungsten alloy. The third metal film 60 ultimately becomes the capacitor upper electrode 26.

Figure 8:
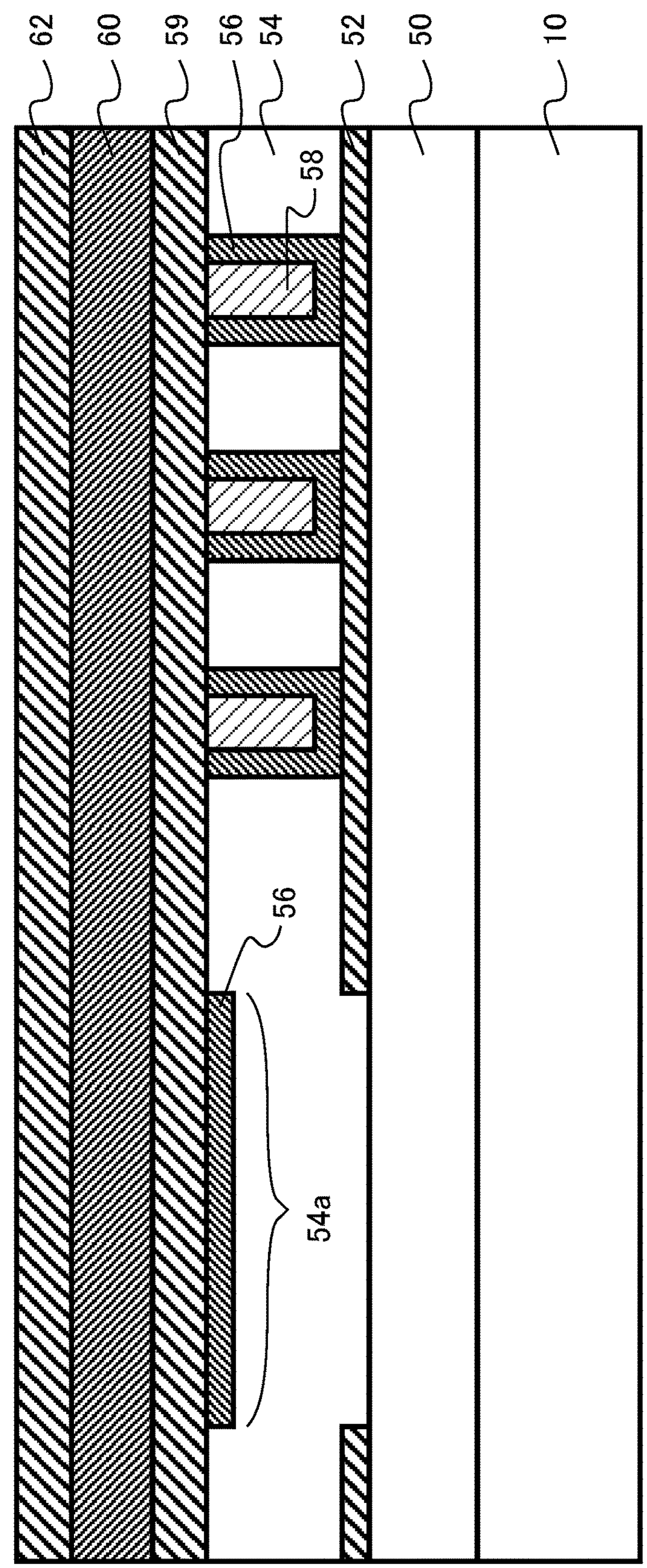
FIG. 8 is a schematic cross-sectional view of the method of manufacturing the semiconductor device according to the first embodiment.

Next, a fifth insulating film 62 is formed on the third metal film 60 (FIG. 8). The fifth insulating film 62 is formed by CVD, for example. The fifth insulating film 62 is silicon nitride, for example. The fifth insulating film 62 ultimately becomes the second etching stopper film 28.

Figure 9:
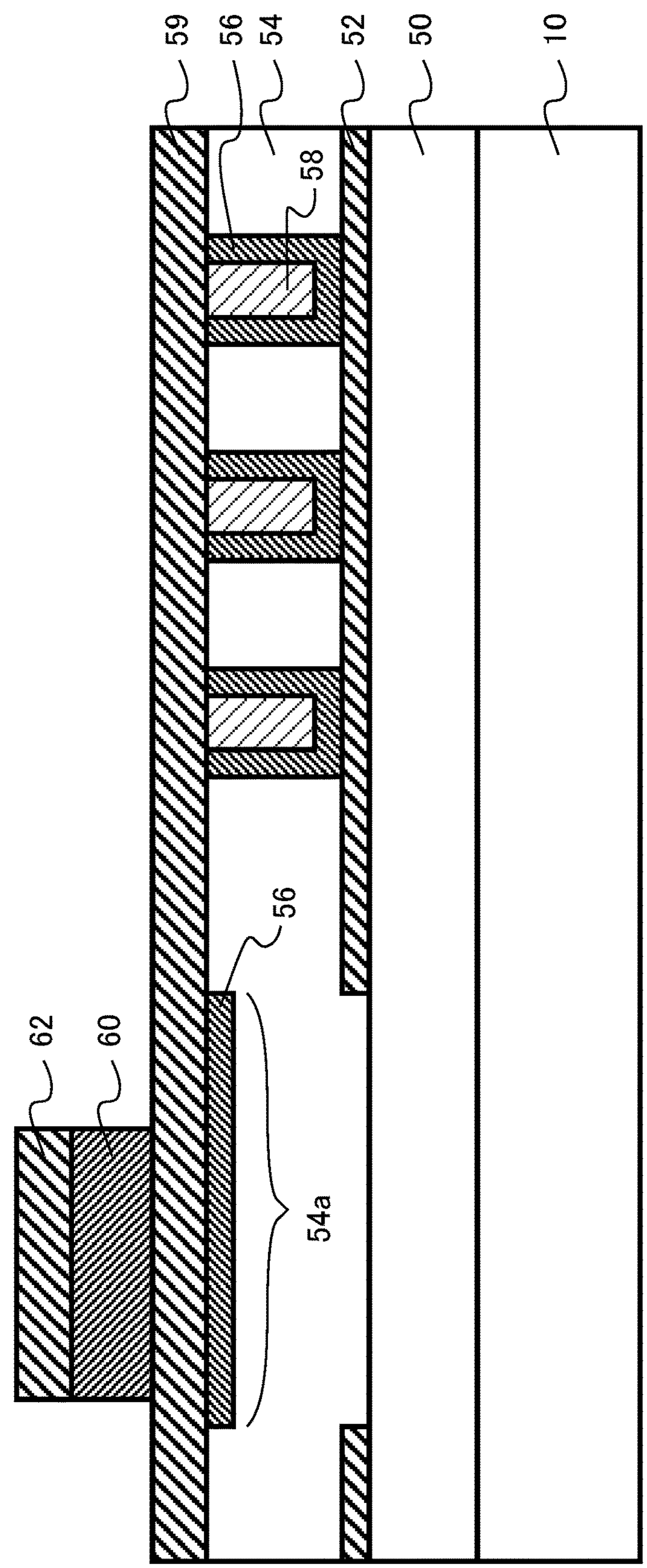
FIG. 9 is a schematic cross-sectional view of the method of manufacturing the semiconductor device according to the first embodiment.

Next, the fifth insulating film 62 and the third metal film 60 are patterned (FIG. 9). The fifth insulating film 62 and the third metal film 60 are left to remain on the first metal film 56 in the recess 54*a*. Patterning of the fifth insulating film 62 and the third metal film 60 is carried out using lithography and RIE, for example.

Next, a sixth insulating film 64 is formed on the fifth insulating film 62 and the fourth insulating film 59. The sixth insulating film 64 is formed by CVD, for example. The sixth insulating film 64 is silicon oxide, for example. The sixth insulating film 64 ultimately becomes the third interlayer insulating layer 30.

Figure 10:
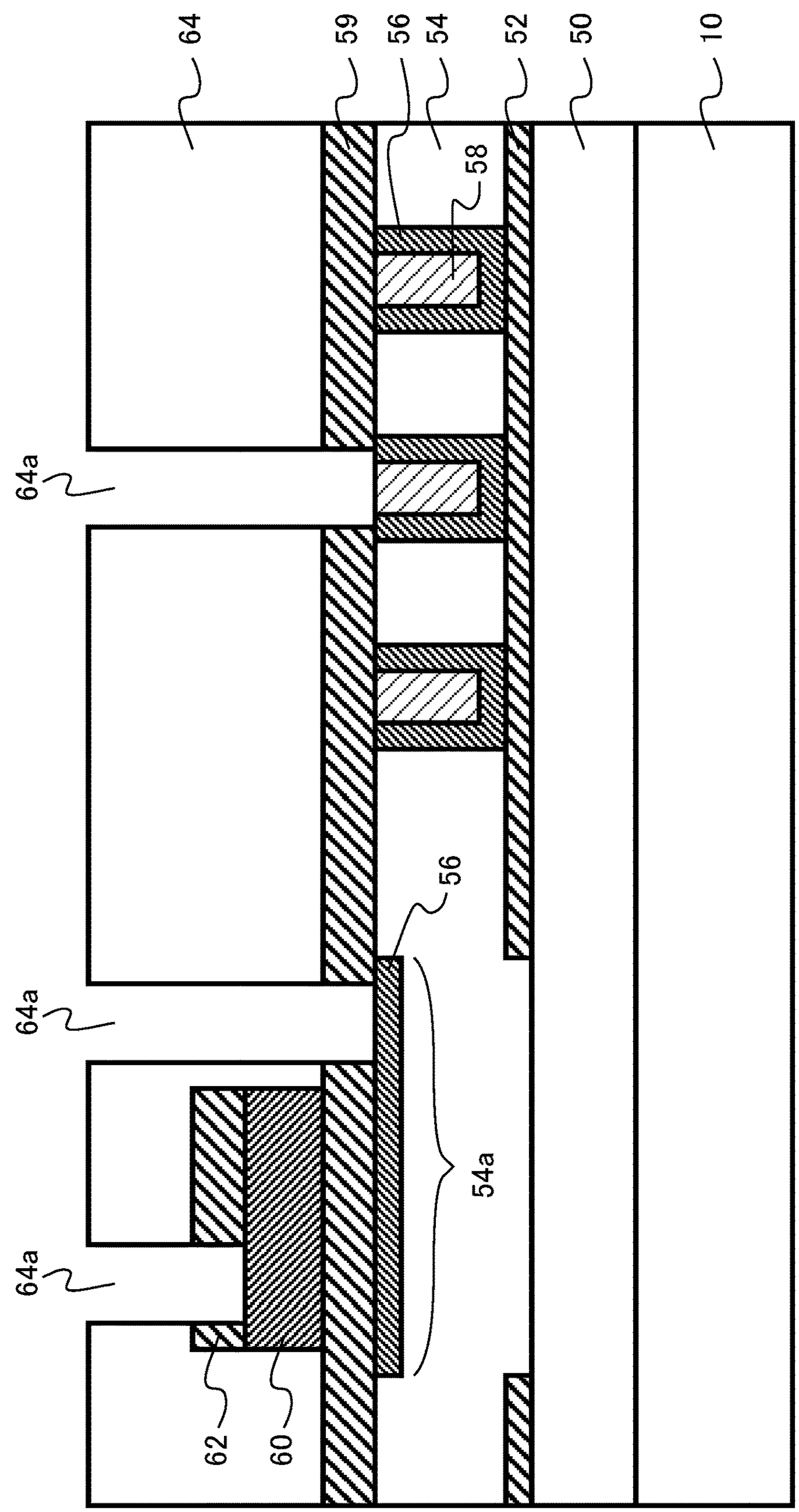
FIG. 10 is a schematic cross-sectional view of the method of manufacturing the semiconductor device according to the first embodiment.

Next, contact holes 64*a* are formed in the sixth insulating film 64, the fifth insulating film 62, and the fourth insulating film 59 (FIG. 10). The contact holes 64*a* are formed using lithography and RIE, for example.

Etching of the contact holes 64*a* is performed in two steps. In a first step, the sixth insulating film 64 is etched by using the fifth insulating film 62 and the fourth insulating film 59 as a stopper. In a second step, the fifth insulating film 62 and the fourth insulating film 59 are etched by switching the etching gas.

Formation of contact holes 64*a* at different depths is straightforward by two-step etching. By two-step etching, excessive etching of the third metal film 60, the first metal film 56, and the second metal film 58, which are below the fifth insulating film 62 and the fourth insulating film 59, is prevented.

Next, a fourth metal film 66 is formed in the contact holes 64*a* and on the sixth insulating film 64. The fourth metal film 66 is formed by CVD, for example. The fourth metal film 66 is tungsten, for example. The fourth metal film 66 ultimately becomes the contact plugs 32.

Figure 11:
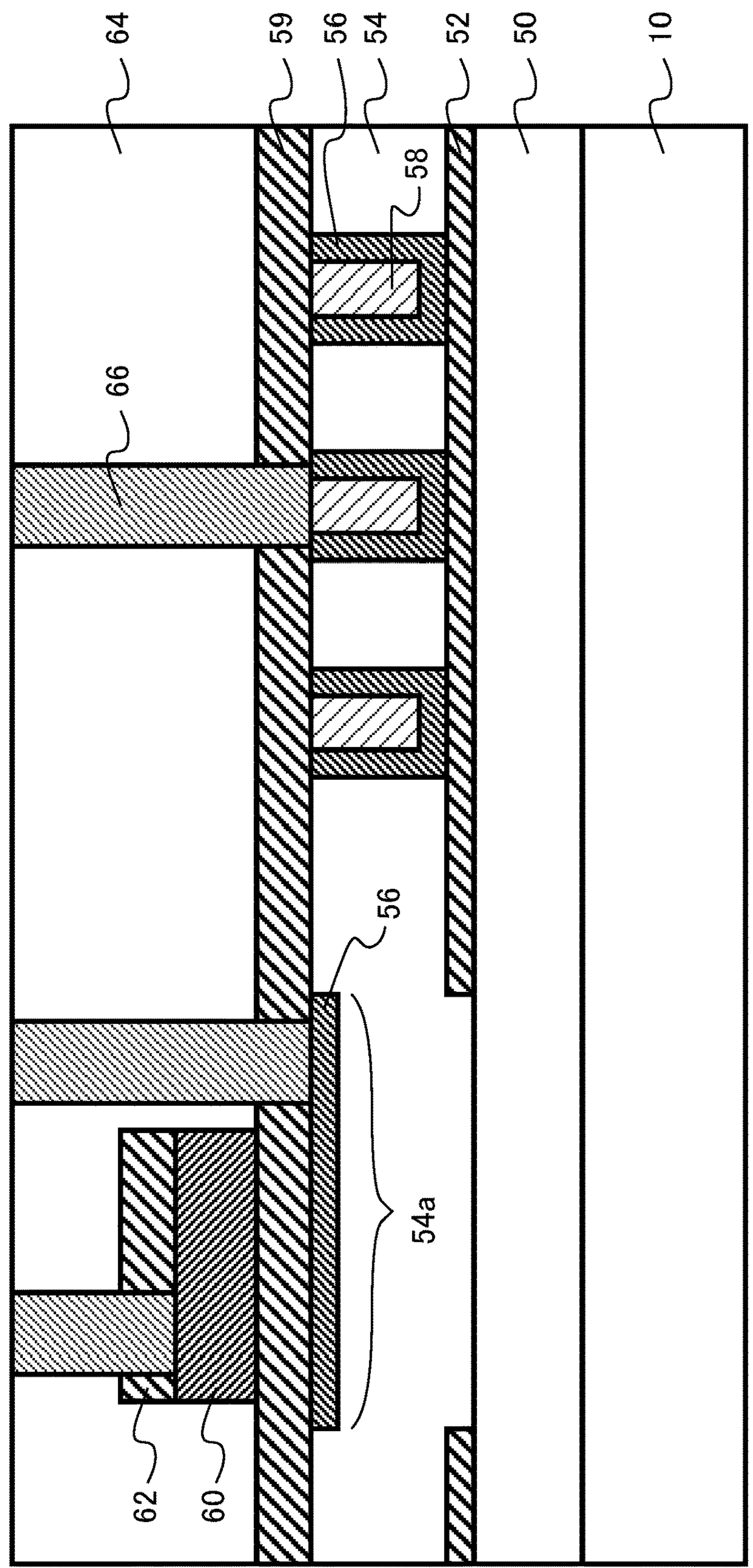
FIG. 11 is a schematic cross-sectional view of the method of manufacturing the semiconductor device according to the first embodiment.

Next, the fourth metal film 66 on the sixth insulating film 64 is removed (FIG. 11). The fourth metal film 66 is removed by CMP, for example. The fourth metal film 66 remains in the contact holes 64*a*.

Next, a fifth metal film 68 is formed on the sixth insulating film 64. The fifth metal film 68 is formed by sputtering, for example. The fifth metal film 68 is an aluminum alloy, for example. The fifth metal film 68 ultimately becomes the second wiring layer 34.

Next, the fifth metal film 68 is patterned. Patterning of the fifth metal film 68 is carried out using lithography and RIE, for example.

Figure 12:
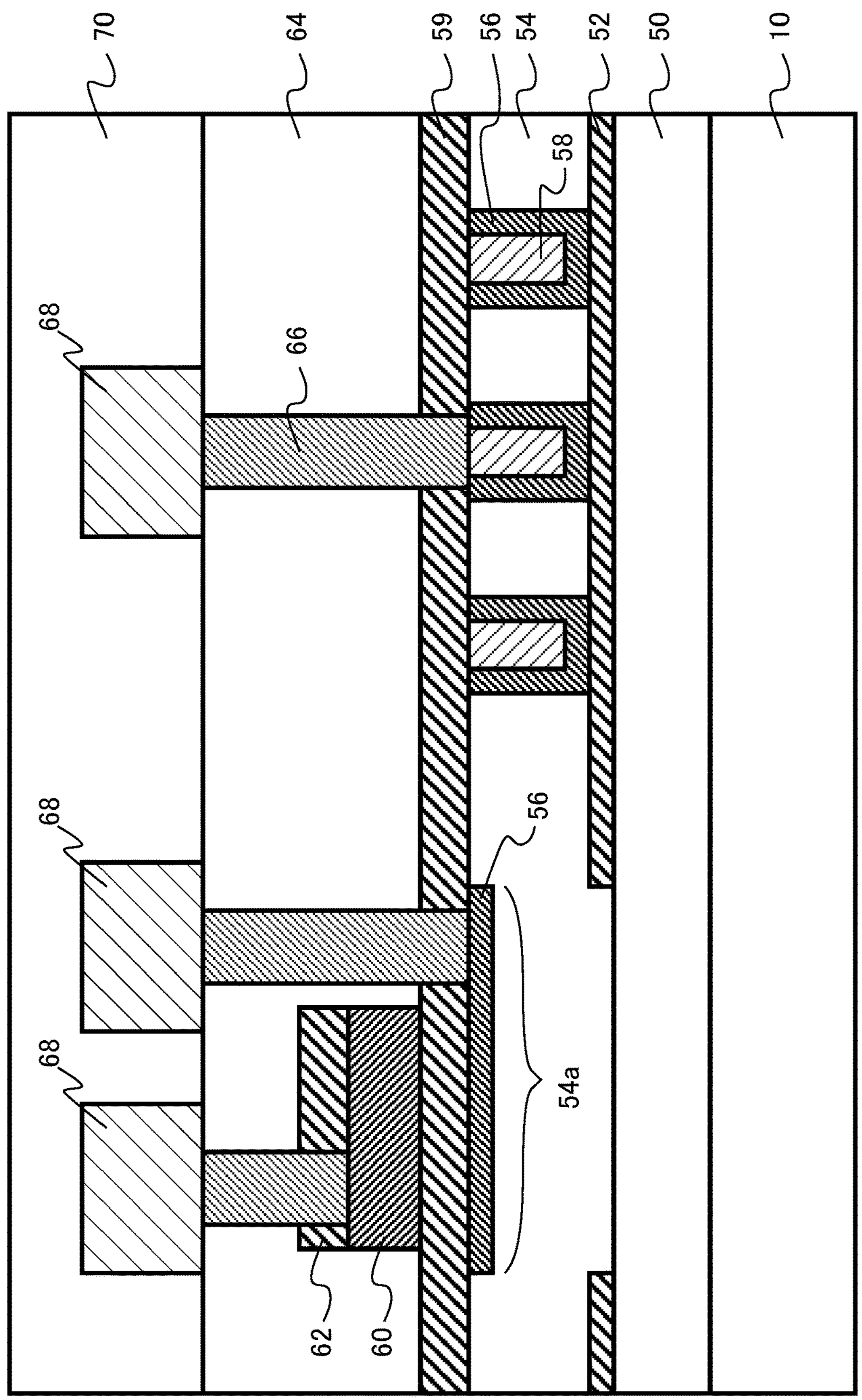
FIG. 12 is a schematic cross-sectional view of the method of manufacturing the semiconductor device according to the first embodiment.

Next, a seventh insulating film 70 is formed on the patterned fifth metal film 68 (FIG. 12). The seventh insulating film 70 is formed by CVD, for example. The seventh insulating film 70 is silicon oxide, for example. The seventh insulating film 70 becomes the fourth interlayer insulating layer 36.

The analog-digital mixed LSI 100 illustrated in FIG. 1 is formed by the foregoing manufacturing method.

The function and effect of the semiconductor device according to the first embodiment will be explained herein below.

As a communications LSI incorporated into a portable telephone or the like, an analog-digital mixed LSI, in which an analog LSI and a digital LSI are mixed, is used. From the perspective of enhancing the characteristics of an analog-digital mixed LSI, enhancing the characteristics of analog-LSI passive elements, for example, enhancing the characteristics of capacitors, is required.

A MIM capacitor uses a metal film for an upper electrode and a lower electrode of the capacitor. By using a metal film for the upper electrode and lower electrode, the parasitic resistance and parasitic capacitance of the capacitor is reduced in comparison with a case where polycrystalline silicon film, for example, is used. Therefore, enhancements to the capacitor characteristics can be realized.

However, by adopting a MIM capacitor, the manufacturing process becomes complex, and there is a risk of a drop in the device yield. In order to suppress a drop in the device yield, a MIM capacitor provided with an easily manufactured structure is desirable.

Figure 13:
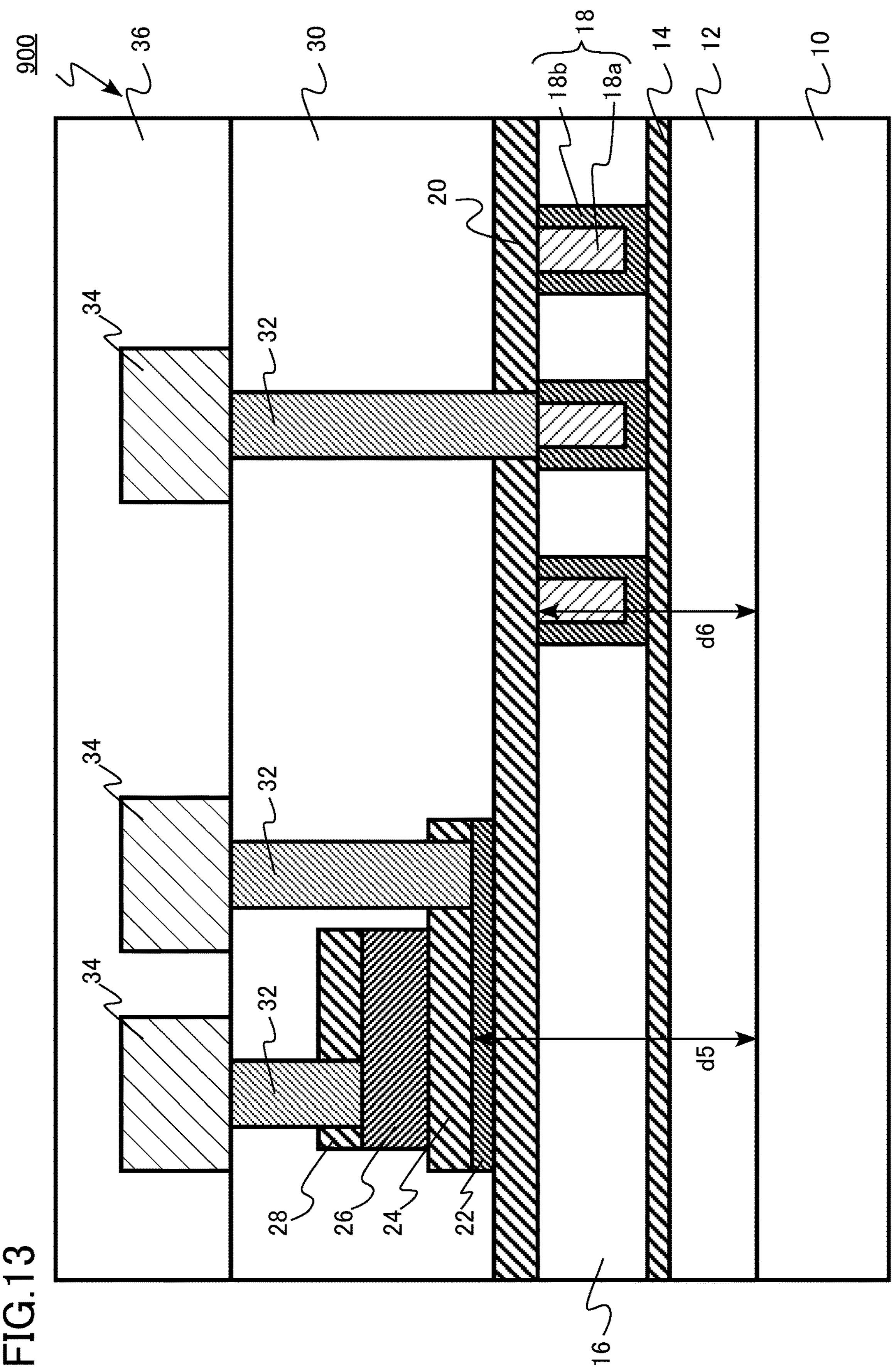
FIG. 13 is a schematic cross-sectional view of a semiconductor device according to a comparative example.

FIG. 13 is a schematic cross-sectional view of a semiconductor device according to a comparative example. The semiconductor device according to the comparative example is an analog-digital mixed LSI 900.

Similar to the analog-digital mixed LSI 100 according to the first embodiment, the analog-digital mixed LSI 900 includes a silicon substrate 10 (semiconductor substrate); a first interlayer insulating layer 12; a first etching stopper film 14; a second interlayer insulating layer 16; a first wiring layer 18 (wiring layer); a cap insulating film 20; a capacitor lower electrode 22; a capacitor insulating film 24; a capacitor upper electrode 26; a second etching stopper film 28; a third interlayer insulating layer 30; a contact plug 32; a second wiring layer 34; and a fourth interlayer insulating layer 36.

The first wiring layer 18 includes a metal layer 18*a* and a barrier metal layer 18*b*.

The analog-digital mixed LSI 900 differs from the analog-digital mixed LSI 100 according to the first embodiment in that the distance (d5 in FIG. 13) from the silicon substrate 10 to the upper face of the capacitor lower electrode 22 is greater than the distance (d6 in FIG. 13) from the silicon substrate 10 to the upper face of the first wiring layer 18. In addition, the capacitor insulating film 24 differs from the analog-digital mixed LSI 100 according to the first embodiment in not being contiguous with the cap insulating film 20.

In manufacturing the analog-digital mixed LSI 900, the capacitor lower electrode 22 and the barrier metal layer 18*b* are not formed simultaneously. In addition, the capacitor insulating film 24 and the cap insulating film 20 are not formed simultaneously. Hence, there are a large number of manufacturing steps and the manufacturing process becomes complicated.

In addition, in the analog-digital mixed LSI 900, the difference in the depths of the contact plugs 32 is large in comparison with the analog-digital mixed LSI 100. Therefore, at the time of forming the contact holes for the contact plugs 32, there is a risk of excessive etching of the capacitor upper electrode 26, the capacitor lower electrode 22, and the first wiring layer 18, which are exposed below the contact holes. Thus, there is a risk of a drop in the device yield.

In the analog-digital mixed LSI 100 according to the first embodiment, the capacitor lower electrode 22 and the barrier metal layer 18*b* can be formed simultaneously. In addition, the capacitor insulating film 24 and the cap insulating film 20 can be formed simultaneously. Hence, there are very few manufacturing steps and the manufacturing process becomes simple.

In addition, the difference in the depths of the contact plugs 32 is small. Therefore, at the time of forming the contact holes 64*a* for the contact plugs 32, excessive etching of the capacitor upper electrode 26, the capacitor lower electrode 22, and the first wiring layer 18, which are exposed below the contact holes 64*a*, is suppressed.

The MIM capacitor of the analog-digital mixed LSI 100 includes an easily manufactured structure. Therefore, a drop in the device yield at the time of manufacturing the analog-digital mixed LSI 100 is suppressed.

Note that the pattern on the flat face of the capacitor lower electrode 22 can be mesh-shaped, for example. By affording the pattern a mesh shape, when the first metal film 56 is polished by CMP, for example, a decrease, caused by dicing, in the thickness of the first metal film 56 in the recess 54*a* can be suppressed.

According to the first embodiment, the foregoing enables a semiconductor device provided with a MIM capacitor having an easily manufactured structure to be realized.

Second Embodiment

In terms of the capacitor lower electrode and the barrier metal layer being contiguous with each other, a semiconductor device according to a second embodiment differs from the semiconductor device according to the first embodiment. Portions of the details of points in common with the first embodiment are omitted from the description hereinbelow.

Figure 14:
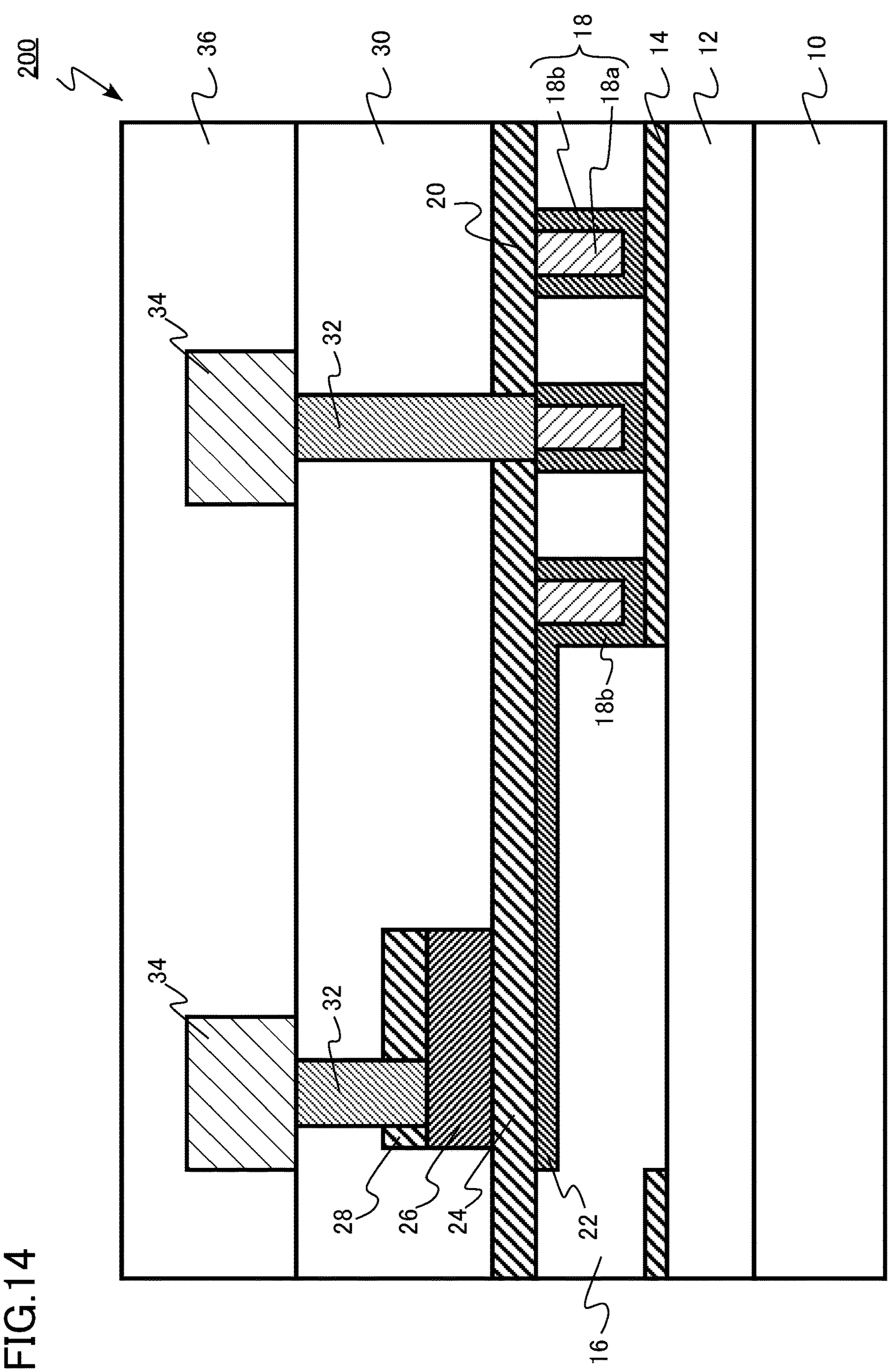
FIG. 14 is a schematic cross-sectional view of a semiconductor device according to a second embodiment.

FIG. 14 is a schematic cross-sectional view of a semiconductor device according to the second embodiment. The semiconductor device according to the second embodiment is an analog-digital mixed LSI 200.

Similar to the analog-digital mixed LSI 100 according to the first embodiment, the analog-digital mixed LSI 200 includes a silicon substrate 10 (semiconductor substrate); a first interlayer insulating layer 12; a first etching stopper film 14; a second interlayer insulating layer 16; a first wiring layer 18 (wiring layer); a cap insulating film 20; a capacitor lower electrode 22; a capacitor insulating film 24; a capacitor upper electrode 26; a second etching stopper film 28; a third interlayer insulating layer 30; a contact plug 32; a second wiring layer 34; and a fourth interlayer insulating layer 36.

The first wiring layer 18 includes a metal layer 18*a* and a barrier metal layer 18*b*.

As illustrated in FIG. 14, the capacitor lower electrode 22 and the barrier metal layer 18*b* are contiguous with each other. The capacitor lower electrode 22 and the barrier metal layer 18*b* are physically continuous.

An example of a method of manufacturing the semiconductor device according to the second embodiment will be explained next. FIGS. 15, 16, 17, 18, and 19 are schematic cross-sectional views of the method of manufacturing the semiconductor device according to the second embodiment.

Up until the formation of the second insulating film 52 on the first insulating film 50, this manufacturing method is similar to the method of manufacturing the semiconductor device according to the first embodiment.

Figure 15:
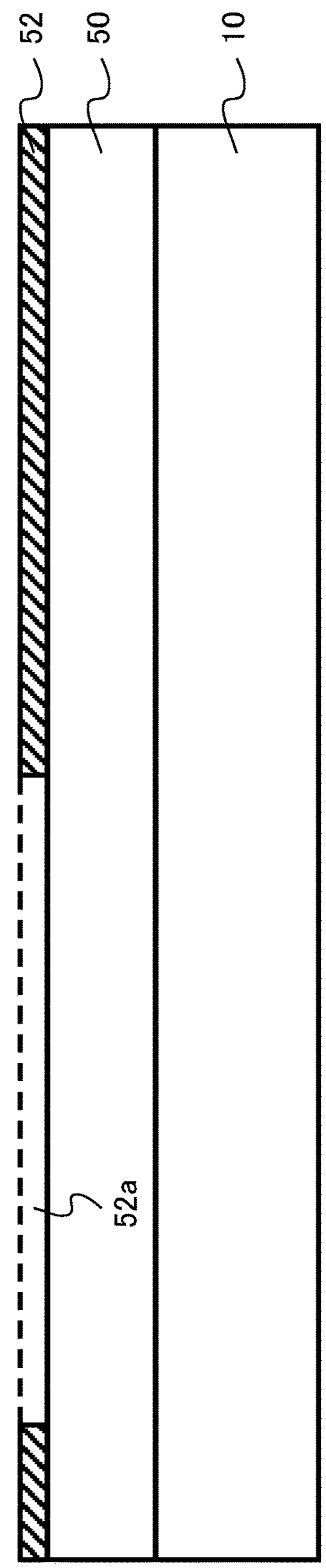
FIG. 15 is a schematic cross-sectional view of a method of manufacturing the semiconductor device according to the second embodiment.

Next, a partial region 52*a* of the second insulating film 52 is removed by etching (FIG. 15). Etching of the partial region 52*a* is carried out using reactive ion etching (RIE) after resist patterning by lithography, for example.

The second insulating film 52 is removed as far as the region where the grooves 54*b* are subsequently formed.

Figure 16:
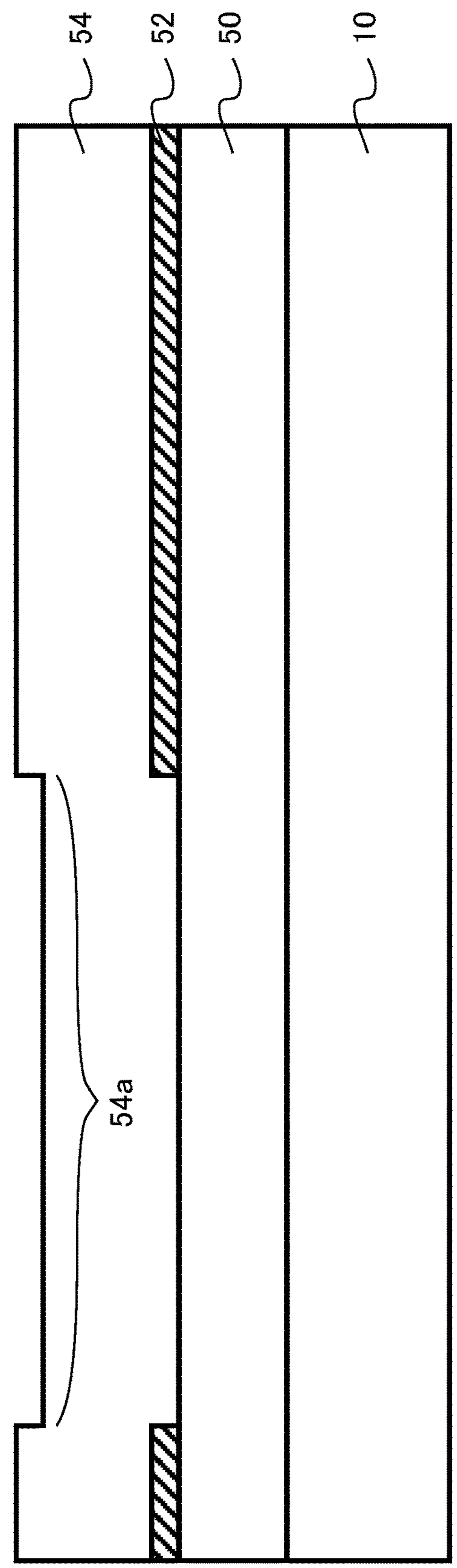
FIG. 16 is a schematic cross-sectional view of the method of manufacturing the semiconductor device according to the second embodiment.

Next, a third insulating film 55 is formed on the second insulating film 52 (FIG. 16). A recess 54*a* is formed in the surface of the third insulating film 54 by a step generated through the etching of the partial region 52*a* of the second insulating film 52.

The third insulating film 54 is silicon oxide, for example. The third insulating film 53 ultimately becomes the second interlayer insulating layer 16.

Figure 17:
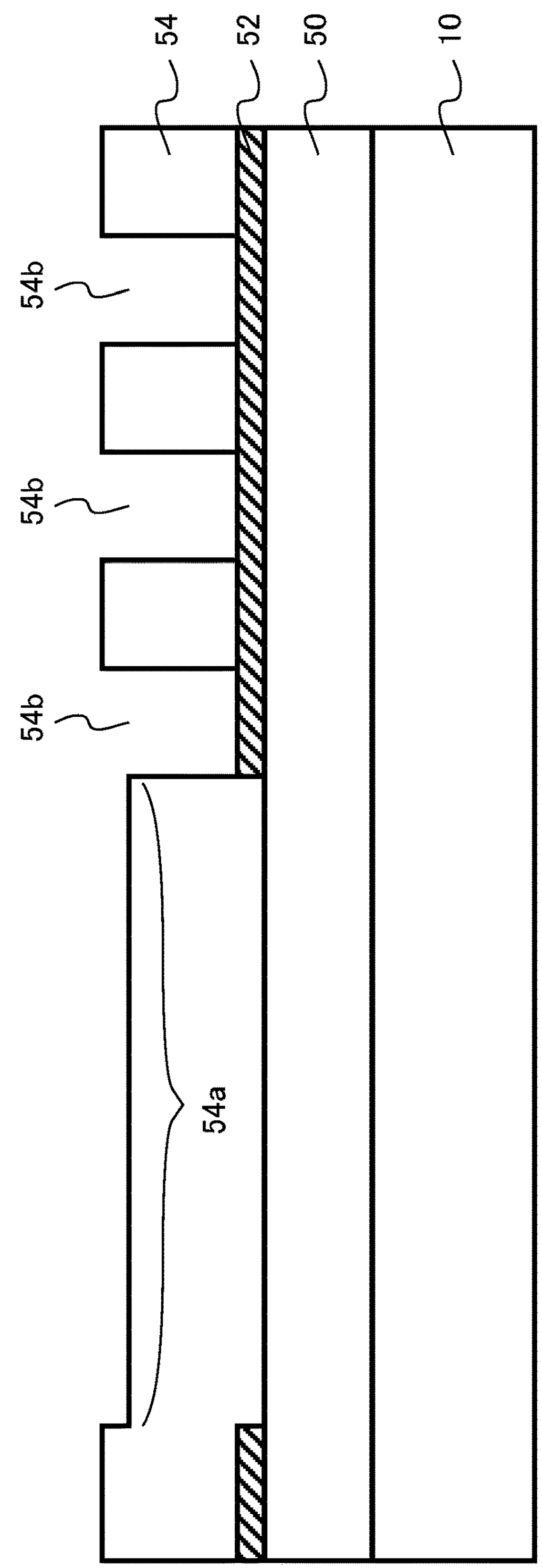
FIG. 17 is a schematic cross-sectional view of the method of manufacturing the semiconductor device according to the second embodiment.

Next, grooves 54*b* are formed in the third insulating film 54 (FIG. 17). The grooves 54*b* reach the second insulating film 52.

The grooves 54*b* are formed using lithography and RIE, for example. The second insulating film 52 serves as a stopper when etching the grooves 54*b*.

Next, a first metal film 56 is formed in the grooves 54*b* and on the third insulating film 54. The first metal film 56 is formed by spattering, for example. The first metal film 56 is, for example, tantalum, titanium, tantalum nitride, titanium nitride, tungsten nitride, or a titanium tungsten alloy.

Figure 18:
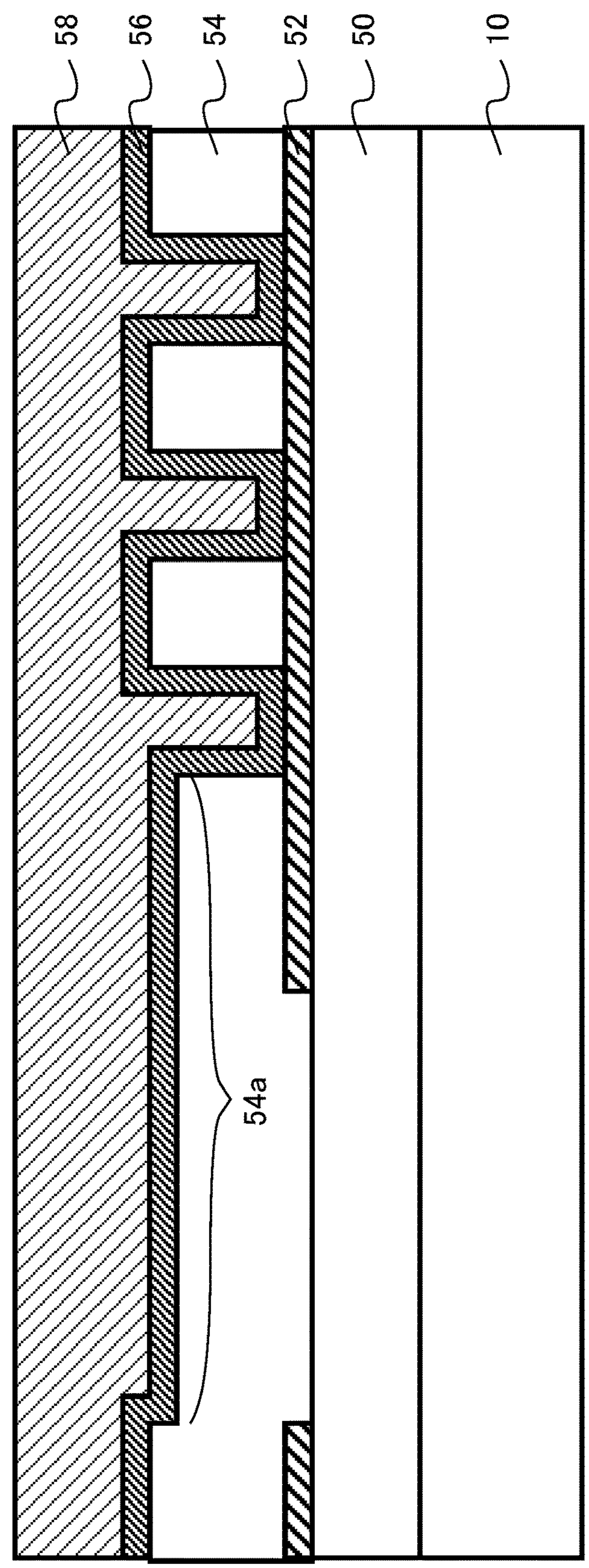
FIG. 18 is a schematic cross-sectional view of the method of manufacturing the semiconductor device according to the second embodiment.

Next, a second metal film 58 is formed on the first metal film 56 (FIG. 18). The second metal film 58 is formed by plating, for example.

Next, the second metal film 58 on the third insulating film 54 is removed. The second metal film 58 is removed using chemical mechanical polishing (CMP), for example.

Figure 19:
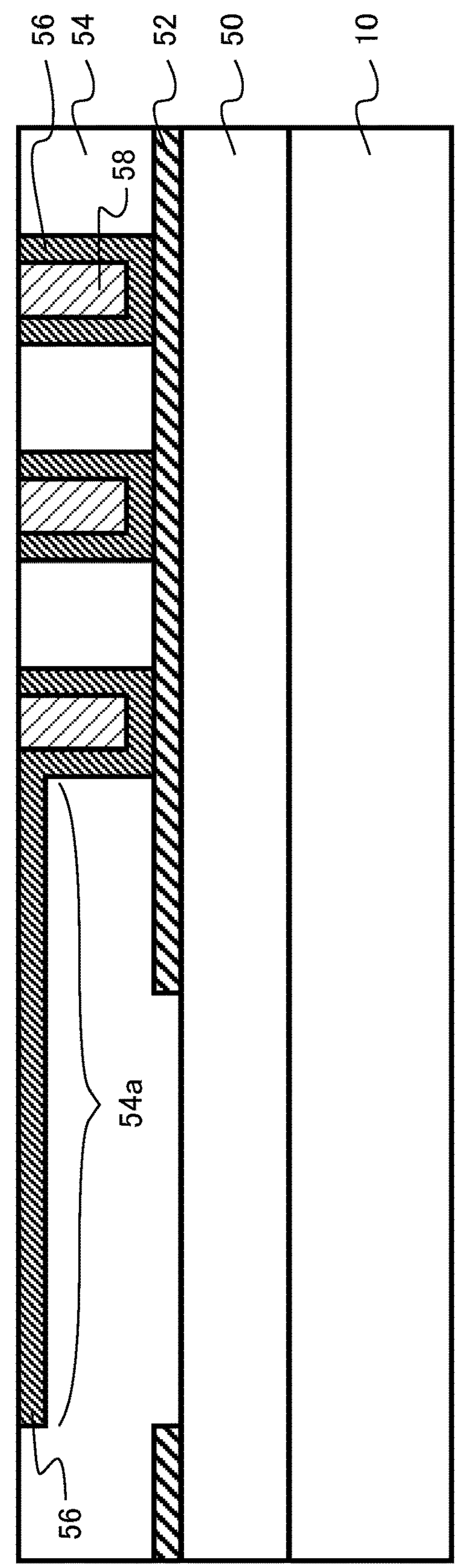
FIG. 19 is a schematic cross-sectional view of the method of manufacturing the semiconductor device according to the second embodiment.

Next, the first metal film 56 on the third insulating film 54 is removed by CMP (FIG. 19). The first metal film 56 is left to remain in the recess 54*a* in the surface of the third insulating film 54. The first metal film 56 in the recess 54*a* is contiguous with the first metal film 56 in the groove 54*b*.

The analog-digital mixed LSI 200 illustrated in FIG. 14 is formed by the foregoing manufacturing method.

In the analog-digital mixed LSI 200 according to the second embodiment, an electrical connection between the capacitor lower electrode 22 and the first wiring layer 18 can be established directly without using other wiring such as the second wiring layer 34, for example. Therefore, there is no need to separately provide a structure for establishing an electrical connection between the capacitor lower electrode 22 and the first wiring layer 18. It is thus possible to reduce the chip area of the analog-digital mixed LSI 200.

Similar to the first embodiment, the second embodiment hereinabove enables a semiconductor device provided with a MIM capacitor having an easily manufactured structure to be realized. Moreover, it is possible to realize a semiconductor device enabling a reduction in the chip area.

While certain embodiments have been described, these embodiments have been presented by way of example only and are not intended to limit the scope of the inventions. Indeed, the semiconductor device and a method of manufacturing a semiconductor device described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:

a semiconductor substrate;

a wiring layer provided on or above the semiconductor substrate, the wiring layer having a first metal layer and a second metal layer in contact with a lower face and a side face of the first metal layer;

a capacitor lower electrode provided on or above the semiconductor substrate, the capacitor lower electrode being the same material as the second metal layer;

a capacitor insulating film provided on the capacitor lower electrode; and a capacitor upper electrode provided on the capacitor insulating film, wherein a distance from the semiconductor substrate to an upper face of the capacitor lower electrode is equal to or less than a distance from the semiconductor substrate to an upper face of the wiring layer, and a distance from the semiconductor substrate to a lower face of the capacitor lower electrode is greater than a distance from the semiconductor substrate to a lower face of the wiring layer.

2. The semiconductor device according to claim 1, further comprising a cap insulating film in contact with the upper face of the wiring layer, the cap insulating film being contiguous with the capacitor insulating film.

3. The semiconductor device according to claim 1, wherein a thickness of the capacitor lower electrode is equal to or less than a thickness of the second metal layer.

4. The semiconductor device according to claim 1, wherein the capacitor lower electrode and the second metal layer are contiguous with each other.

5. The semiconductor device according to claim 1, wherein the capacitor insulating film is silicon nitride.

6. The semiconductor device according to claim 1, wherein the distance from the semiconductor substrate to the upper face of the capacitor lower electrode is the same as the distance from the semiconductor substrate to the upper face of the wiring layer.

7. A method of manufacturing a semiconductor device, the method comprising:

forming a first insulating film on or above a semiconductor substrate;

forming a second insulating film on the first insulating film;

removing a partial region of the second insulating film by etching;

forming a third insulating film on the second insulating film;

forming, in the third insulating film, a groove that reaches the second insulating film;

forming a first metal film in the groove and on the third insulating film;

forming a second metal film on the first metal film;

removing the second metal film on the third insulating film;

removing the first metal film on the third insulating film by chemical mechanical polishing while leaving the first metal film in a recess of a surface of the third insulating film formed due to a step generated by the removing the partial region;

forming a fourth insulating film on the first metal film and on the third insulating film;

forming a third metal film on the fourth insulating film; and patterning the third metal film so as to leave the third metal film on the fourth insulating film, the fourth insulating film being formed on the first metal film in the recess.

8. The method of manufacturing a semiconductor device according to claim 7, wherein the second insulating film and the fourth insulating film are silicon nitride.

9. The method of manufacturing a semiconductor device according to claim 7, wherein the second metal film is copper.

* * * * *